United States Patent
Umotoy et al.

(10) Patent No.: US 6,302,964 B1
(45) Date of Patent: Oct. 16, 2001

(54) ONE-PIECE DUAL GAS FACEPLATE FOR A SHOWERHEAD IN A SEMICONDUCTOR WAFER PROCESSING SYSTEM

(75) Inventors: Salvador P. Umotoy, Antioch; Lawrence C. Lei; Anh N. Nguyen, both of Milpitas; Steve H. Chiao, Fremont, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/526,345

(22) Filed: Mar. 16, 2000

Related U.S. Application Data

(63) Continuation-in-part of application No. 09/098,969, filed on Jun. 16, 1998.

(51) Int. Cl.[7] .................................................. C23C 16/00
(52) U.S. Cl. ........................................................... 118/715
(58) Field of Search ................................................ 118/715

(56) References Cited

U.S. PATENT DOCUMENTS

| | | | |
|---|---|---|---|
| 5,453,124 | * 9/1995 | Moslehi et al. | 118/715 |
| 5,595,606 | * 1/1997 | Fujikawa | 118/715 |
| 5,709,757 | * 1/1998 | Hatano et al. | 134/22.14 |
| 5,781,693 | * 7/1998 | Ballance et al. | 392/416 |
| 5,871,586 | * 2/1999 | Crawley | 118/715 |

* cited by examiner

Primary Examiner—Richard Bueker
(74) Attorney, Agent, or Firm—Thomason, Moser & Patterson, LLP

(57) ABSTRACT

A one-piece gas distribution faceplate for a showerhead. The one-piece gas distribution faceplate includes a first surface, a second surface, and a third surface. The one-piece gas distribution faceplate comprises a plurality of first gas holes extending through the one-piece gas distribution faceplate between the first surface and the second surface. The one-piece gas distribution faceplate has an internal gas distribution cavity defined by a plurality of interconnecting channels. A plurality of second gas holes extend through the one-piece gas distribution faceplate between the first surface into a plurality of the interconnecting channels. The interconnecting channels are fluidly coupled to a plenum that is in turn connected to at least one gas conduit. The gas conduit extends to the third surface.

15 Claims, 8 Drawing Sheets

US 6,302,964 B1

ONE-PIECE DUAL GAS FACEPLATE FOR A SHOWERHEAD IN A SEMICONDUCTOR WAFER PROCESSING SYSTEM

CROSS-REFERENCE TO RELATED APPLICATION

This application is a continuation in part application of the prior, co-pending patent application Ser. No. 09/098,969, filed on Jun. 16, 1998, and hereby incorporated herein by reference.

BACKGROUND OF THE DISCLOSURE

1. Field of the Invention

The present invention relates to semiconductor wafer processing systems and, more particularly, to a gas distribution showerhead for supplying at least two process gases to a reaction chamber of a semiconductor wafer processing system.

2. Description of the Background Art

Semiconductor wafer processing systems generally contain a process chamber having a pedestal for supporting a semiconductor wafer within the chamber proximate a processing region. The chamber forms a vacuum enclosure defining, in part, the process region. A gas distribution assembly or showerhead provides one or more process gases to the process region. The gases are then heated and/or supplied energy to form a plasma which performs certain processes upon the wafer. These processes may include chemical vapor deposition (CVD) to deposit a film upon the wafer or an etch reaction to remove material from the wafer.

In processes that require multiple gases, generally the gases are combined within a mixing chamber that is then coupled to the showerhead via a conduit. For example, in titanium nitride deposition using titanium tetrachloride (TiCl4) and ammonia (NH3) as process gases, the two process gases are supplied to a mixing chamber along with respective carrier gases of helium and hydrogen where they are combined to form a gaseous mixture. The gaseous mixture is then coupled through a conduit to a distribution plate, where the plate contains a plurality of holes such that the gaseous mixture is evenly distributed into the process region. As the gaseous mixture enters the process region and is infused with energy, a chemical reaction occurs between the titanium tetrachloride and the ammonia such that the titanium tetrachloride chemically reacts with the ammonia (i.e., the TiCl4 is reduced by the NH3) to produce titanium nitride. The titanium nitride is deposited on the wafer in a chemical vapor deposition reaction.

Other two gas chemical vapor deposition reactions include the thermal decomposition of tetradiethylaminotitanium (TDEAT) in combination with ammonia to produce titanium nitride, the thermal decomposition of tetradimethylaminotitanium (TDMAT) in combination with ammonia or a nitrogen-hydrogen mixture to produce titanium nitride, or a reduction of tungsten hexafluoride (WF6) using hydrogen (H2) to produce tungsten. In any of these cases and any others that require two or more gases to process a wafer, multiple gases need be uniformly supplied to the process region.

Although it is generally advantageous to mix the gases prior to release into the process region to ensure that the gases are uniformly distributed into the process region, the gases tend to begin reduction, or otherwise react, within the mixing chamber. Consequently, deposition or etching of the mixing chamber, conduits and other chamber components may result prior to the gaseous mixture reaching the process region. Additionally, reaction by products may accumulate in the chamber gas delivery components.

In an effort to maintain the gases in separate passageways until they exit the distribution plate into the process region, U.S. Pat. No. 5,595,606 issued Jan. 21, 1997 (the "'606 patent") discloses a multiple block stack that forms a showerhead that ostensibly maintains two gases in separate passageways until they exit the distribution plate into the process region. As such, the gases do not mix or react with one another until they reach the process region near the wafer.

FIG. 14 depicts a cross sectional view of the prior art showerhead 50 of the '606 patent which includes an upper, a middle and a lower block 58, 60, and 62 having a first set of gas passages 54a, 54b, 54c (collectively, passageway 54) and a second set of gas passages 52a, 52b and 52c (collectively, passageway 52) that branch from the upper block to the lower block in a manner that maintains independence of the passageways. Gas is provided to passageway 52 through port 64 and to passageway 54 through port 72. The passageways 52 and 54 are branched using manifolds 80 and 82 formed in middle block 60. Specifically, passageway 52 is branched through a manifold 80 and passageway 54 is branched through a manifold 82.

A coolant channel 84 is provided in the lower block 62 near the gas outlets 78 for cooling the gas outlets 78 to maintain the showerhead at a temperature below the liquification temperature of a process gas, e.g., below 40 degrees C. for TDEAT.

The blocks 58, 60 and 62 are stacked upon one another and O-rings 90 are placed between the blocks 58, 60, and 62 in an attempt to seal the gas within the showerhead. Such O-rings 90 are effective in ensuring that the gas does not leak out of the showerhead but are ineffective in ensuring that the gases do not commingle within the showerhead by leaking between the gas passageways 52 and 54 at the interfaces of the various blocks. Such commingling defeats the purpose of the dual gas passageway assembly, i.e., the gases are not completely separated until they exit the lower block 62 into the process region. Additionally, the existence of O-rings within a process chamber leads to the possibility that the O-ring material will breakdown and contaminate the chamber and/or the wafer surface.

Therefore, there is a need in the art for a showerhead that provides at least two gases to the process region without commingling the gases prior to reaching the process region and without using O-rings to seal the gases into the showerhead.

SUMMARY OF THE INVENTION

The disadvantages associated with the prior art are overcome by the present invention of a one-piece gas distribution faceplate to be used in a showerhead. The one-piece gas distribution faceplate includes a first surface, a second surface, and a third surface. The one-piece gas distribution faceplate comprises a plurality of first gas holes extending through the one-piece gas distribution faceplate between the first surface and the second surface. The one-piece gas distribution faceplate has an internal gas distribution cavity defined by a plurality of interconnecting channels. A plurality of second gas holes extend through the one-piece gas distribution faceplate between the first surface into a plurality of the interconnecting channels. The interconnecting channels are fluidly coupled to a plenum that is in turn connected to at least one gas conduit. The gas conduit extends to the third surface.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
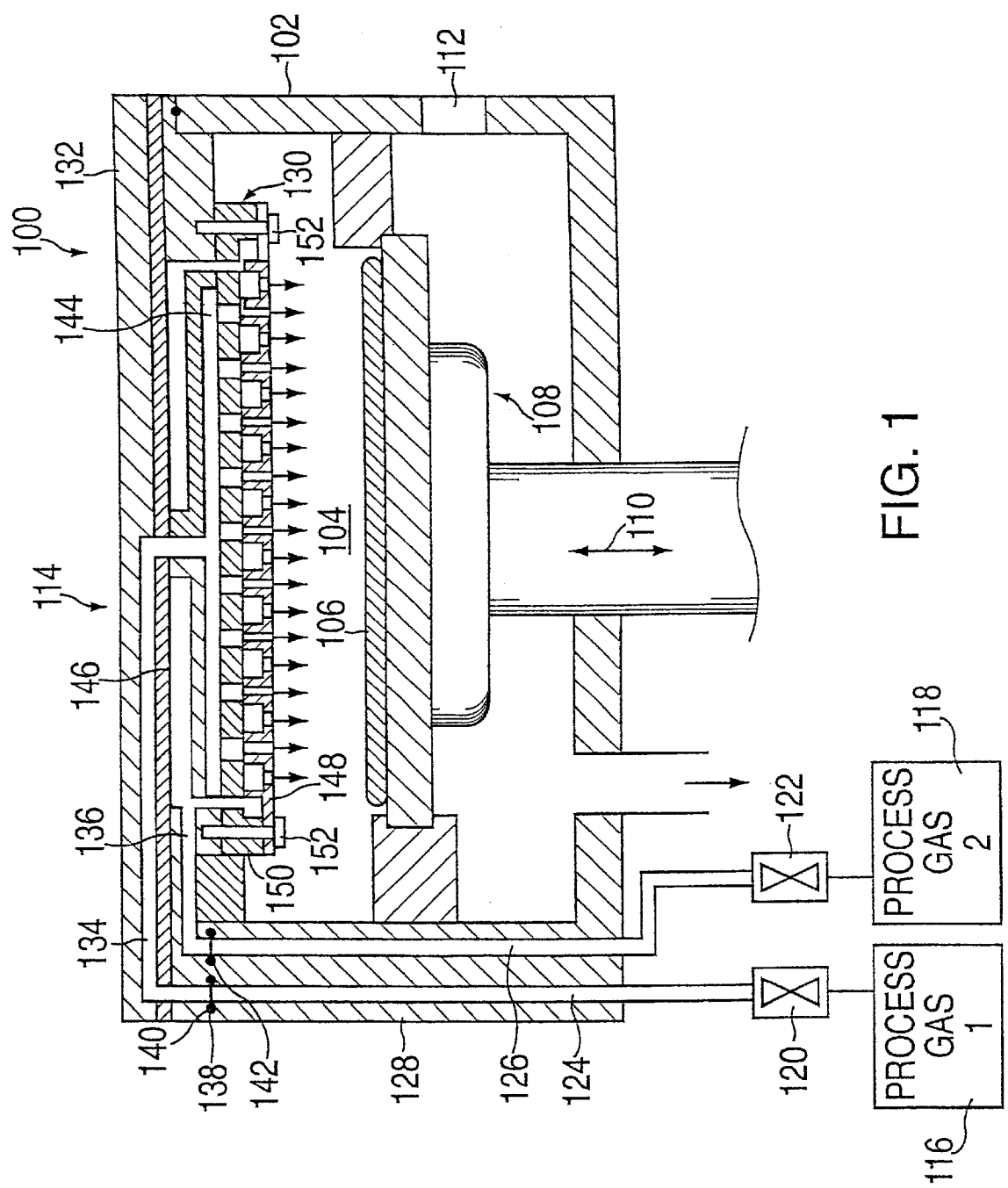
FIG. 1 depicts a cross sectional view schematically depicting a semiconductor wafer process reactor containing the showerhead of the present invention.

FIG. 1 depicts a cross-sectional schematic view of a semiconductor wafer processing reaction chamber, for example, a chemical vapor deposition reactor 100. The reactor 100 contains an enclosure 102 (also generally referred to as a chamber) defining a process region 104. A substrate 106, such as a semiconductor wafer, is maintained proximate the process region 104 upon a pedestal 108. The pedestal 108 moves vertically (as indicated by arrow 110) within the enclosure 102 to lower the pedestal to a position that allows the substrate 106 to be removed through a slit valve 112. While in the lowered position, a new substrate 106 positioned upon the pedestal 108. Thereafter, the pedestal 108 is raised into a process position, as shown, which places the wafer 106 proximate the process region 104. Process gases are supplied through the showerhead 114. In the preferred embodiment of the invention a plurality of gases are used to process the wafer, illustratively, two gases are used, process gas 1 (e.g., titanium tetrachloride TiCl4) and process gas 2 (e.g., ammonia NH3). These gases form a gaseous mixture that is required to process the wafer, i.e., form a deposit on the wafer or chemically etch the wafer. The process gases from respective sources 116 and 118 are respectively supplied through valves 120 and 122 to conduits 124 and 126 that run through the wall 128 of the enclosure 102 up to the shower head 114. The showerhead 114 forms the lid of the reactor 100.

The showerhead 114 has two main components, a faceplate 130 and a gas distribution manifold 132. The gas distribution manifold 132 has two conduits 134 and 136 that respectively couple to the conduits 124 and 126 that carry the gases through the chamber wall 128. The conduits at the interface 138 between the showerhead 114 and the wall 128 of the process chamber 102 are effectively sealed using O-rings 140 and 142 that circumscribe each conduit 124 and 126. The first process gas is provided via the conduit 134 to a cylindrical chamber 144 that distributes the first process gas to the faceplate 130. The second process gas is provided via conduit 136 to an annular chamber 146 that distributes the second process gas to the faceplate 130.

The faceplate 130 contains two components, a lower gas distribution plate 148 and a upper gas distribution plate 150. These two plates contain various channels and holes that define two distinct passageways for the two process gases to enter the process region 104. The specific arrangement of channels and holes are described in detail with respect to FIGS. 3, 4 and 5 for the lower gas distribution plate 148 and FIGS. 6, 7 and 8 for the upper gas distribution plate 150. To define the channels without using O-rings as seals between the channels and holes, the lower and upper gas distribution plates are fused to one another to form a unitary faceplate 130. The faceplate is bolted (using a plurality of bolts 152) to the gas distribution manifold 132. The mating surfaces of the faceplate 130 and the manifold 132 have a flatness of 1 to 3 mm and, as such, can be bolted without using O-rings and a sufficient seal is created to avoid gas commingling. The faceplate and manifold assembly are generally fabricated from a metal such as aluminum or nickel.

Figure 2:
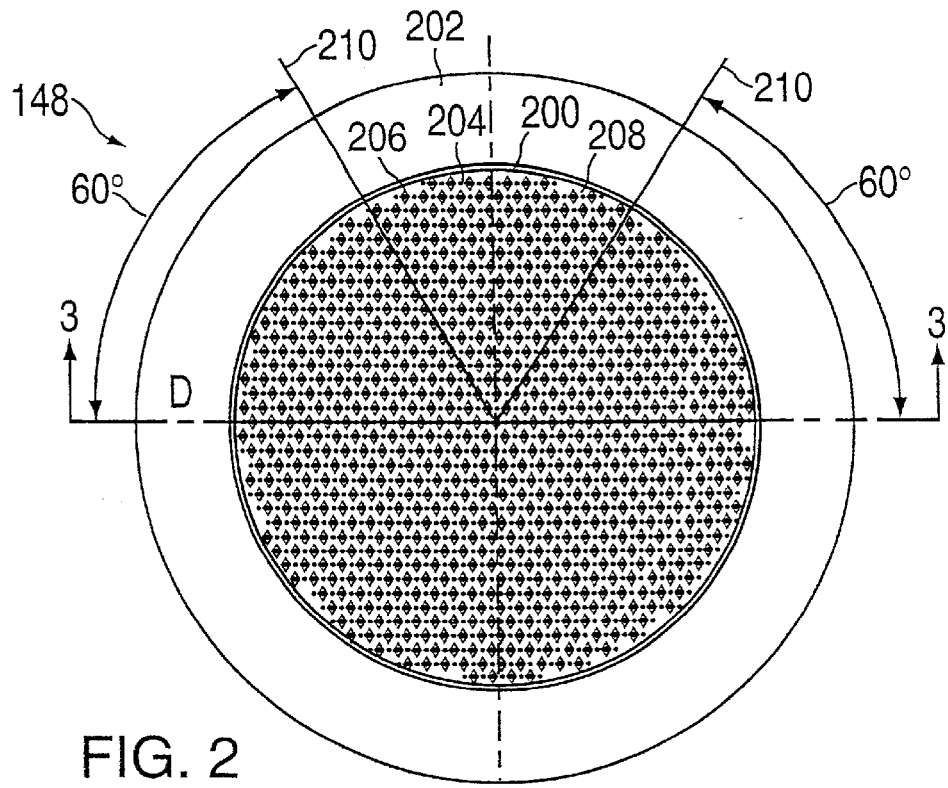
FIG. 2 depicts a top plan view of a lower gas distribution plate.
Figure 3:
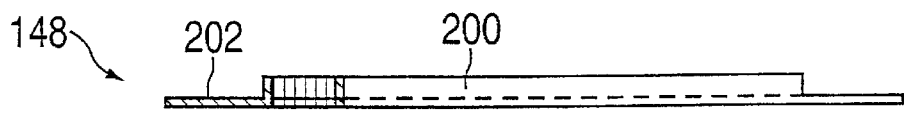
FIG. 3 depicts a partial cross sectional view of the lower gas distribution plate taken along lines 3—3 of FIG. 2.
Figure 5:
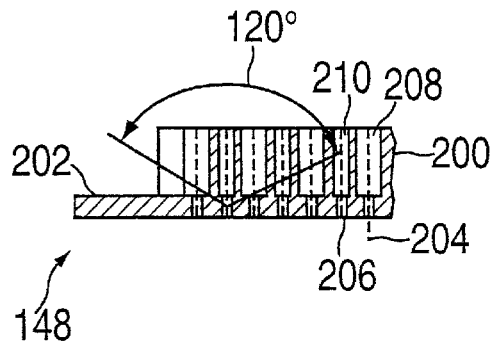
FIG. 5 depicts a cross sectional view of the detailed portion of the lower gas distribution plate taken along lines 5—5 in FIG. 4.
Figure 4:
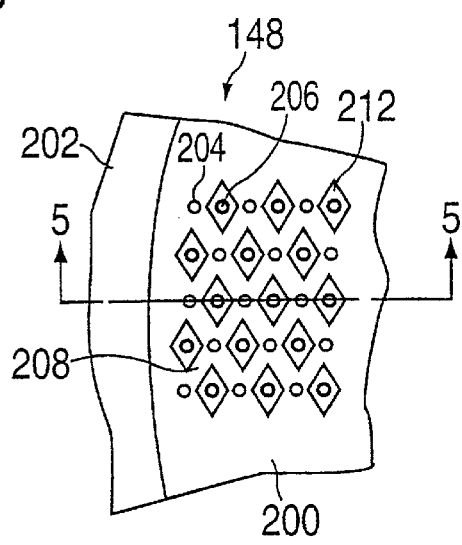
FIG. 4 depicts detailed top plan view of one portion of the lower gas distribution plate.

FIG. 2 depicts a top plan view of the lower gas distribution plate 148; FIG. 3 depicts a partial cross sectional view of the lower gas distribution plate 148 taken along line 3—3 in FIG. 2; FIG. 4 depicts a detailed top plan view of a portion of the lower gas distribution plate 148 depicted in FIG. 2; and FIG. 5 depicts a detailed cross-sectional view taken along lines 5—5 in FIG. 4. To best understand the disclosure of the lower gas distribution plate the reader should simultaneously refer to FIGS. 2, 3, 4 and 5.

More specifically, the lower gas distribution plate 148 is circular or disc-like in plan form having a central portal region 200 and a circumferential flange 202 where the flange 202 has a thickness of approximately 2.5 mm and the central portal region 200 has a thickness of approximately 1.21 cm. The central region 200 is defined by the width of the flange 202 which is approximately 2.54 cm. The central portal region 200 contains two sets of holes 204 and 206 where each hole has a center-to-center spacing of approximately 6.35 mm from a neighboring hole. Generally, holes 206 for the first gas (e.g. holes for TiCl4 are 0.025 inches) are approximately the same size as the holes 204 for the second gas (e.g., holes for NH3). However, the choice of hole size for each gas is purely a process condition. As such, hole size will vary depending upon gas flow rate, gas pressure, gas type, chamber pressure and the like. The hole size may also vary across the faceplate surface such that gas flow rates through the holes are correlated with the location of the hole in the faceplate.

The central portal region 200 is cut with grooves or channels 208 having a width of 3.173 mm and a depth of 9.525 mm. They are cut at an angle of 60° from the horizontal (as shown by lines 210). As such, a plurality of interconnecting channels 208 are formed over the holes 204 for the second gas. The holes 206 for the first gas extend through the portal region 200 and are counterbored with bores 210. The junction of the bore 210 and the hole 206 is angled at, for example, 120°. The channels 208 interconnect in a "criss-cross" pattern and, when enclosed at the open top thereof, form a gas manifold for the second gas. There are approximately 700 holes 204 and 206 for each of the gases to exit the lower gas distribution plate 148.

Figure 6:
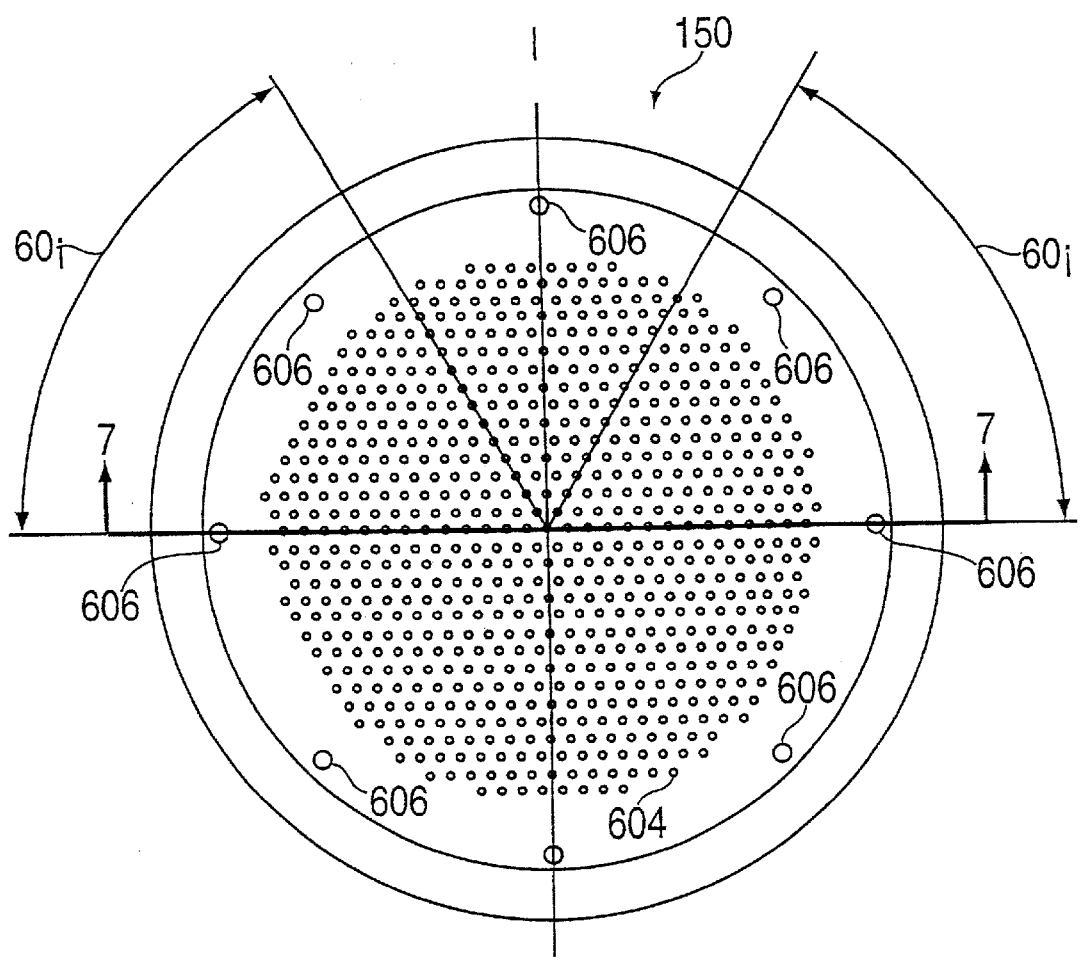
FIG. 6 depicts a top plan view of a upper gas distribution plate.
Figure 7:
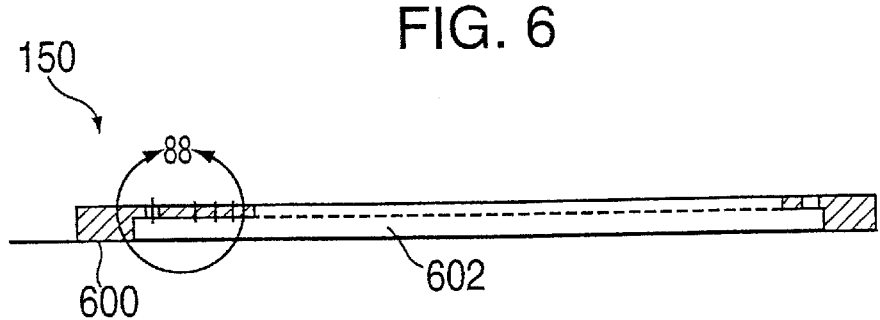
FIG. 7 depicts a partial cross sectional view of the upper gas distribution plate taken along lines 7—7 of FIG. 6.
Figure 8:
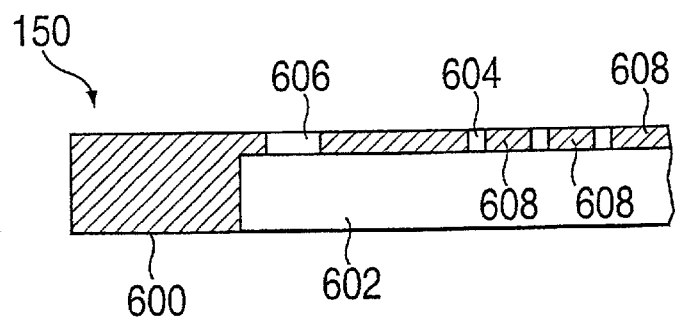
FIG. 8 depicts a detailed cross sectional view of a portion of the upper gas distribution plate taken along line 8—8 of FIG. 7.

FIGS. 6, 7 and 8 respectively depict a top plan view of the upper gas distribution plate 150 a cross sectional view of the plate 150 taken along line 7—7 in FIG. 6, and a detailed cross sectional view of a portion of the plate 150 taken along line 8—8 of FIG. 7. The upper gas distribution plate 150 has an outer edge (flange support 600) that, when assembled, interfaces and rests upon the flange 202 of the lower gas distribution plate 148. Central to the upper gas distribution plate 150 is a recessed portion 602 that substantially matches the raised central portal region 200 of the lower gas distribution plate 148 such that the second and lower gas distribution plates interfit. The upper gas distribution plate 150 contains a plurality of centrally located holes 604 having a diameter of approximately 1.6 mm and these holes align with the bores 210 for the first gas in the lower gas distribution plate 148. In addition, proximate the edge of the upper gas distribution plate 150, but inward of the flange support 600, are a plurality of holes 606 that are used to distribute gas to the channels 208 in the lower gas distribution plate 148. Upon assembly, the flat portions 608 of the upper gas distribution plate 150 between the gas distribution holes 604 form a top of the channels 208 in the lower gas distribution plate 148. There are approximately 700 holes in the upper gas distribution plate 150 which match identically to the arrangement of the first gas holes 206 and their associated counterbores 210 in the lower gas distribution plate 148. The gas distribution holes 606 that provide gas to the channels 208 in the lower gas distribution plate 148 are arranged at 45° angles with respect to one another about the periphery of the upper gas distribution plate 150 such that there are 8 holes, each having a diameter of approximately 6.35 mm.

Figure 9:
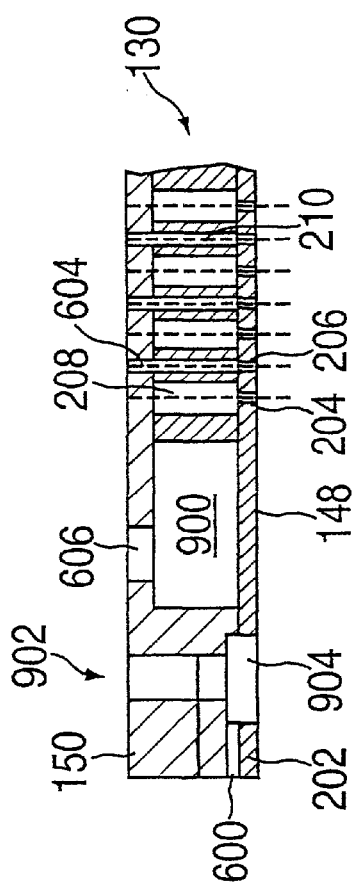
FIG. 9 depicts a detailed cross sectional view of the assembled portions of the lower and upper gas distribution plates forming a faceplate for the showerhead of the present invention.

FIG. 9 depicts an assembled view of a portion of the lower and upper gas distribution plates 148 and 150. To assemble the faceplate 130, the surfaces of the lower and upper gas distribution plates 148, 150 have to be uniform to within 1 to 3 mm. To fuse aluminum distribution plates, the mating surfaces are then coated with silicon-rich aluminum, the lower and upper distribution plates 148, 150 are clamped to one another and then the assembly is placed into a furnace where the lower and upper gas distribution plates fuse to one another to form one single element, the faceplate 130. As such, no O-rings are necessary to retain the gas within the faceplate or to maintain separation of the gases. The plates 148 and 150 fuse at the junction of the flange 202 and flange support 600 and at the surfaces 608 to the tops of the diamond-shaped islands 212. Specifically, the flange 202 and the flange support 600 fuse at the outer edge 902 forming a sufficient seal to maintain all of the gases inside the faceplate. Additionally, the upper gas distribution plate 150 and the flange 202 of the lower gas distribution plate 148 form a circumferential plenum 900 that provides gas to the gas channels 208 formed in the lower gas distribution plate 148. The holes 606 provide gas to this circumferential plenum 900. The upper gas distribution plate 150 forms the tops of the channels 208 such that uniform rectangular cross section channels 208 are formed to distribute the second process gas to the holes 204 in the lower gas distribution plate 148. The holes 604 in the upper gas distribution plate 150 are aligned with the holes 210 in the lower gas distribution plate 148 to allow the first process gas to pass through both distribution plates 148 and 150 unimpeded to reach the process region of the reactor chamber. Once fused, a plurality of mounting bores 904 (that are countersunk to enable the bolt heads (not shown) to remain flush with the faceplate surface) are formed in the circumferential edge region 902 to facilitate affixing the faceplate 130 to the gas distribution manifold 132.

If the faceplate is fabricated of a material that reacts with a chamber process gas, the faceplate is generally plated with a protective material to avoid corrosion of the faceplate. For an aluminum faceplate that is intended to be exposed to chlorine, the faceplate is plated with nickel to a depth of 0.2 to 0.4 mils. For maximum protection, the faceplate should be plated on the inside and outside surfaces.

Figure 10:
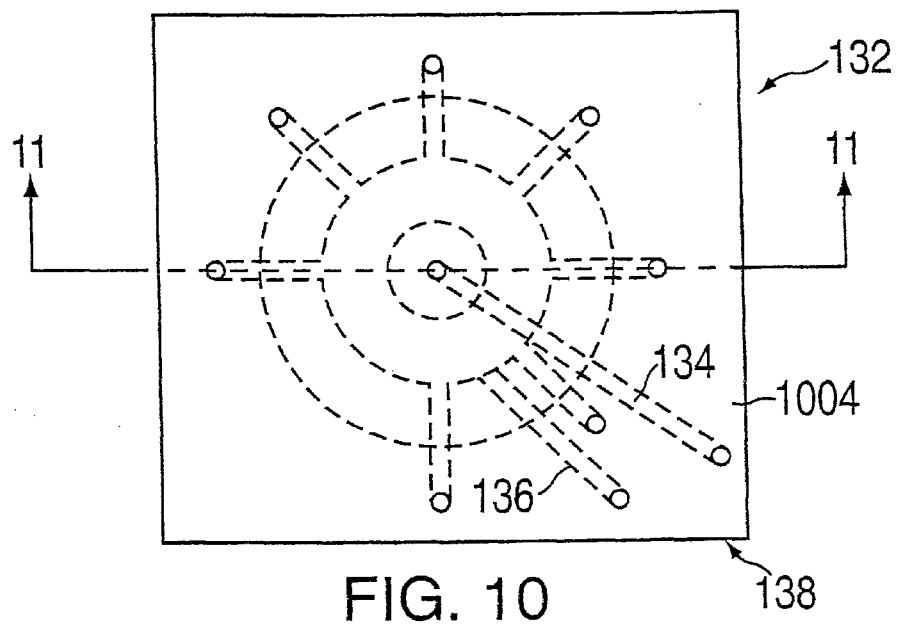
FIG. 10 depicts a top plan view of a gas distribution manifold assembly.
Figure 11:
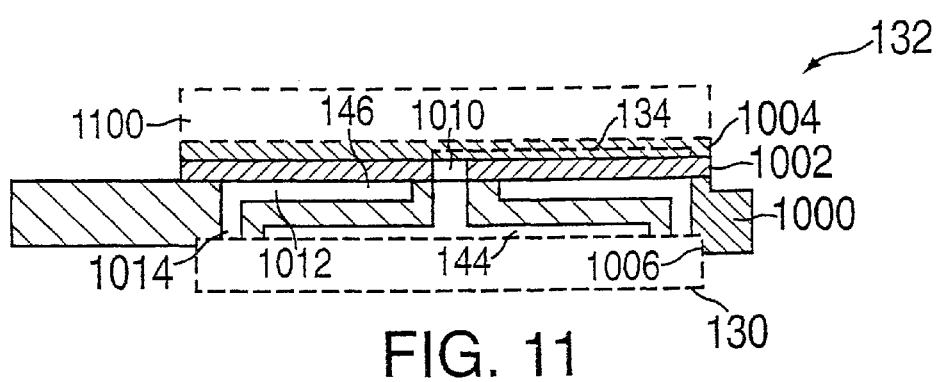
FIG. 11 depicts a cross sectional view of the gas distribution manifold assembly taken along line 11—11 of FIG. 10.
Figure 12:
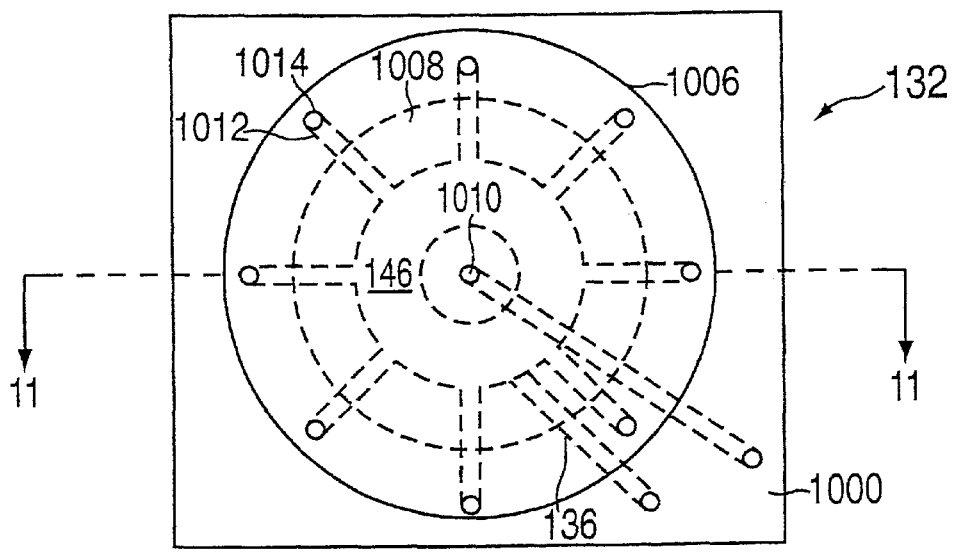
FIG. 12 depicts a bottom plan view of the gas distribution manifold assembly.
Figure 14:
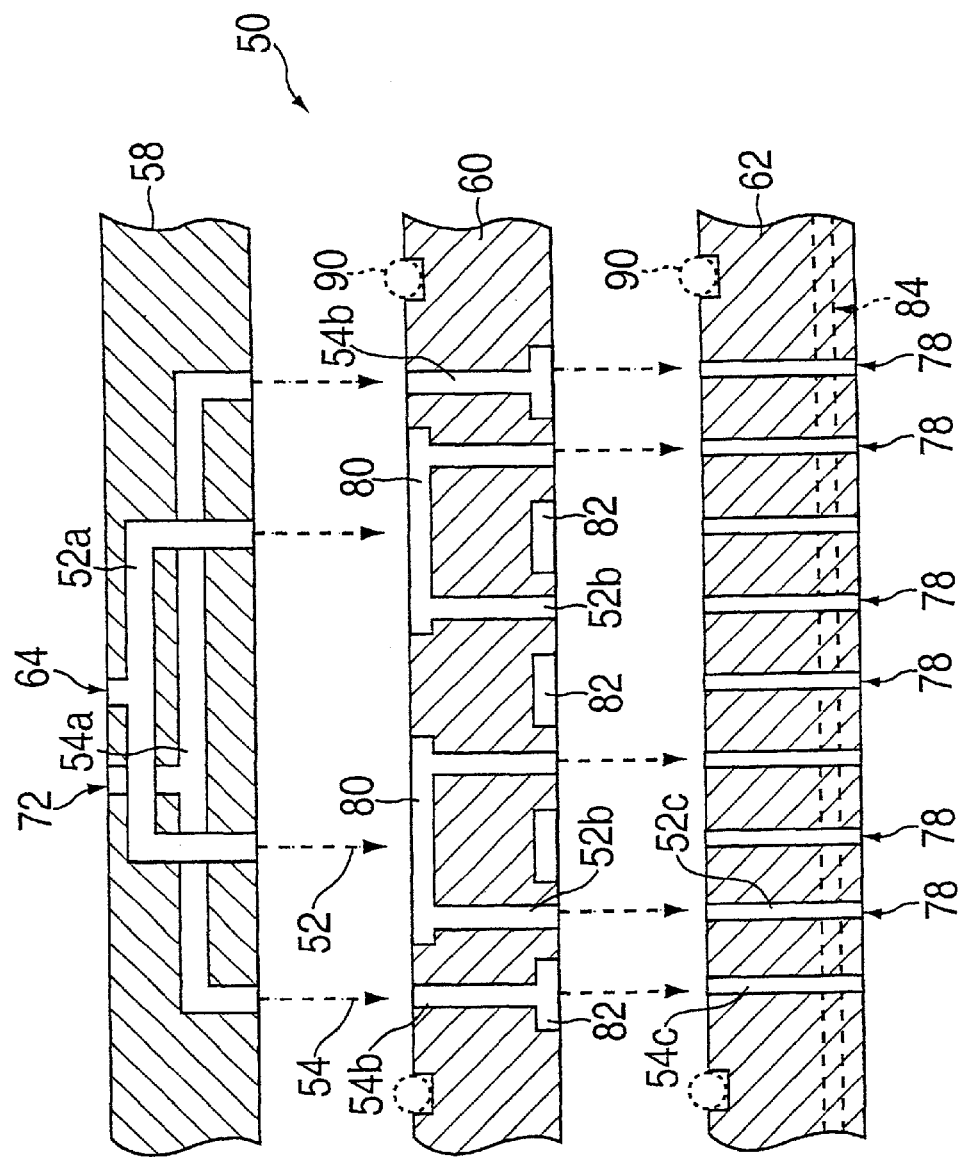
FIG. 14 depicts a cross sectional exploded view of a prior art dual gas showerhead.

FIGS. 10, 11 and 12 respectively depict a top plan view of the gas distribution manifold 132, a cross-sectional view of the gas distribution manifold 132 taken along lines 11—11 of FIG. 10, and a bottom plan view of the gas distribution manifold 132. The gas distribution manifold 132 supplies each of the process gases from the conduits 124 and 126 depicted in FIG. 1 to the faceplate 130. The manifold 132 comprises three components; a lower plate 1000, a middle plate 1002 and a top plate 1004. The bottom plate 1000 contains a first cylindrical cavity having a diameter substantially the same as the diameter of the faceplate 130. The cavity 1006 is defined to interfit with the faceplate 130. A second cavity 1008 is coaxial with the first cavity but has a smaller diameter such that when the faceplate 130 abuts the manifold 132 by mounting in the cavity 1006 the chamber 144 is formed. This chamber is used to distribute the first process gas to the holes 604 in the upper gas distribution plate 150. A centrally located bore 1010 couples the chamber 144 to a conduit 134 that extends from the central bore to a location near the edge of the upper plate 1004. At that location, the conduit 134 couples to the conduit 124 in the chamber wall. To form conduit 134 the upper plate 1004 has a channel milled into the bottom surface thereof through which gas will flow. The channel is completed by mounting the upper plate 1004 to the middle plate 1002 such that the top surface of the middle plate forms the bottom of the channel 134.

To couple the second process gas from the conduit 126 and the wall of the chamber to the faceplate, an annular channel 146 is defined in the manifold 132. The annular chamber is formed by milling an annular channel 146 in the top surface of the lower plate 1000. Radially directed channels 1012 connect the annular channel 146 to a bore 1014 at the distal end of each channel 1012. Additionally, a channel that forms conduit 136 is formed in the lower plate 1000 extending from the annular channel 146 to the conduit coupling location at interface 138. The top of the annular channel 146 is closed by middle plate 1002 such that a closed annular channel 146 is formed with radially extending channels 1012 and bores 1014 that couple the second process gas to the distribution plenum 900 in the faceplate 130.

To fabricate the gas distribution manifold assembly 132 the lower, middle and upper plates 1000, 1002, and 1004 have their mating surfaces coated with a silicon-rich aluminum film, the entire assembly is clamped and placed in a furnace at a temperature of approximately 550° C. to fuse the contacting surfaces to one another and form a unitary manifold assembly 132. As such, no O-rings are necessary to maintain a separation between the process gases.

The manifold assembly and faceplate that form the showerhead are fabricated of aluminum or some other thermally conductive material such as nickel. As such the showerhead can be coupled to a cold plate or other cooling apparatus that will maintain the entire showerhead at a uniform and constant temperature. Such a cold plate could easily be formed using an aluminum body having cooling channels cut or otherwise formed therein such that a coolant could be circulated through the cooling plate while the cooling plate is mounted to a top of the manifold 132. An illustrative placement of a cold plate 1100 mounted to the top of the manifold assembly 132 is shown in FIG. 11.

The showerhead of the foregoing embodiment of the invention has been tested in a 10-5 torr vacuum test and no cross talk has been experienced between the gases provided to each of the gas input conduits 134 and 136.

Figure 13:
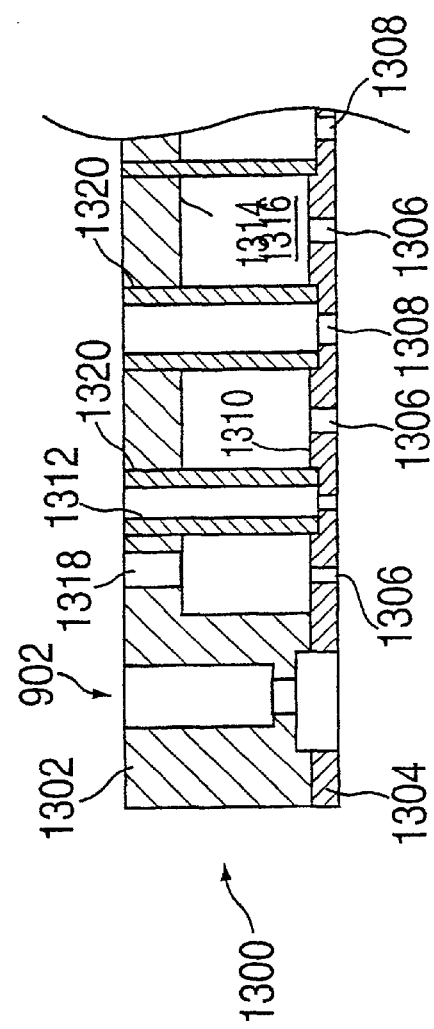
FIG. 13 depicts a cross sectional view of a portion of an alternative embodiment of a showerhead.

FIG. 13 depicts a cross sectional view of a portion of an alternative embodiment of a faceplate 1300. This embodiment contains an upper gas distribution plate 1302 and a lower gas distribution plate 1304. The lower gas distribution plate 1304 is similar to the previously described lower gas distribution plate (148 of FIG. 9) in that the plate 1304 defines a plurality of gas distribution holes (one set of holes 1306 is for distributing a first gas and one set of holes 1308 is for distributing a second gas). Every other hole is counterbored from the upper side 1310 of the lower plate 1304. In each counterbore is located one end of a vertically oriented tubular conduit (tubes) 1312. The other end of each tube 1312 passes through a hole 1320 in the upper gas distribution plate 1302. The upper and lower gas distribution plates 1302 and 1304 and the tubes 1312 are fabricated of a metal such as nickel or aluminum. Once assembled, the faceplate is placed in a furnace and heated to braze (fuse) the contacting surfaces to one another in a similar manner as the previous embodiment was fabricated.

As with the previous embodiment, if the faceplate is fabricated of a material that reacts with a chamber process gas, the faceplate is generally plated with a protective material to avoid corrosion of the faceplate. For an aluminum faceplate that is intended to be exposed to chlorine, the faceplate is plated with nickel to a depth of 0.2 to 0.4 mils. For maximum protection, the faceplate should be plated on the inside and outside surfaces.

Each of the tubes 1312 defines a gas passage for the second gas to reach the gas distribution holes 1308. The lower surface 1314 of the upper gas distribution plate 1302 and the upper surface 1310 of the lower gas distribution plate 1304 define a cavity 1316 that distributes the first gas to the gas distribution holes 1306. The first gas is supplied to the cavity 1316 via one or more portals 1318. A gas manifold (not shown, but identical to the manifold 132 of FIG. 1) is coupled to the faceplate 1300 and supplies the first gas to the tubes 1312 and the second gas to the portals 1318 in the faceplate 1300. Mounting and operation of a showerhead containing this embodiment of the faceplate is identical to the previous embodiment.

An alternative manufacturing process for either embodiment of the invention involves stacking die-cut layers (each layer being approximately 5 mils thick) to "build up" the faceplate structure. The stack or laminate of layers is then placed in a furnace and fused into a unitary faceplate. The material of the faceplate is a metal such as nickel or aluminum.

Figure 15:
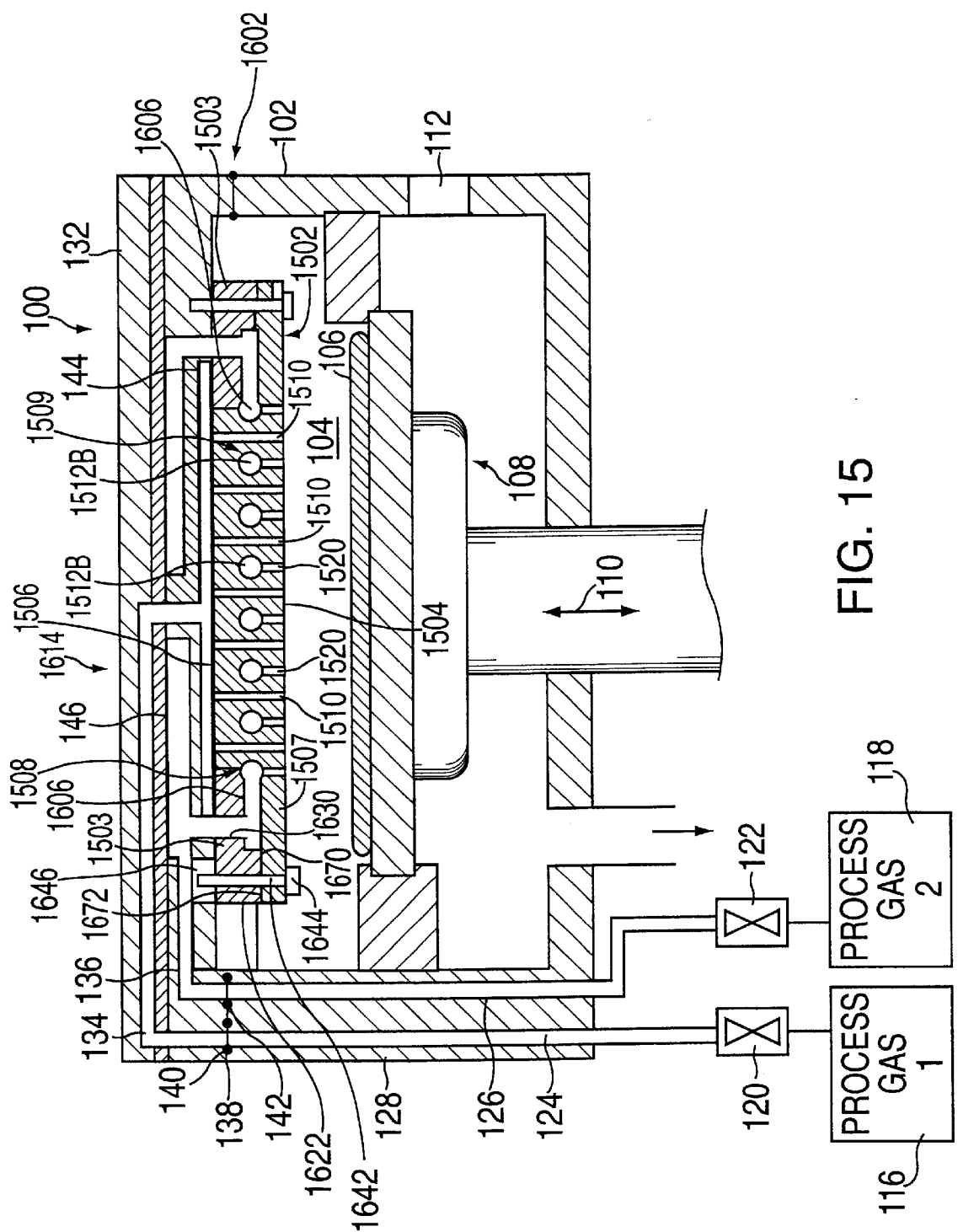
FIG. 15 is a cross sectional view schematically depicting another embodiment of gas distribution manifold assembly.
Figure 16:
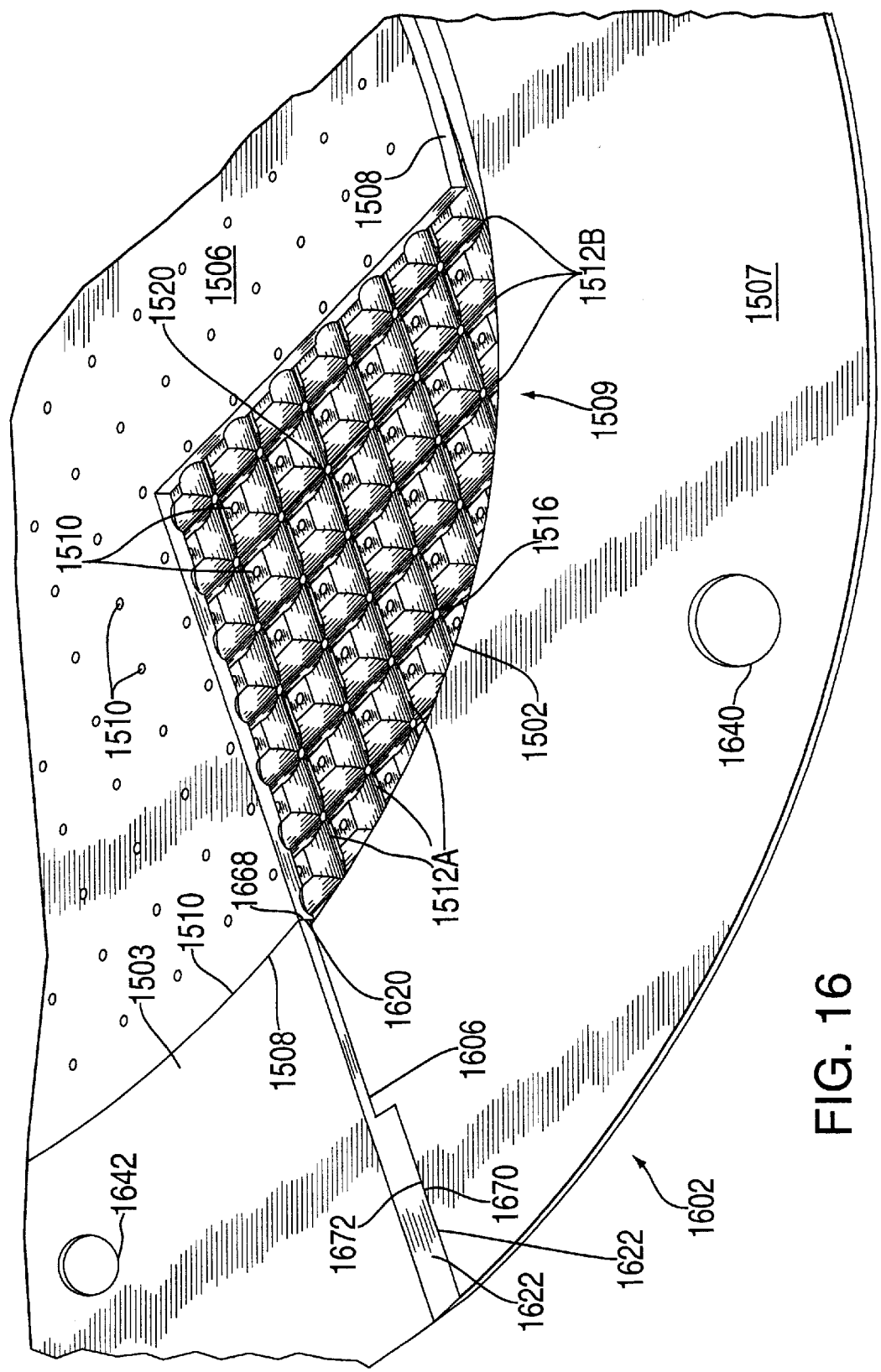
FIG. 16 depicts a partially broken-away perspective view of one embodiment of a one-piece gas distribution faceplate shown in FIG. 15.

FIGS. 15 and 16 depict another embodiment of showerhead 1602 comprising a one-piece gas distribution faceplate 1502 and a peripheral ring 1503. In this portion, FIG. 15 should be read in conjunction with FIG. 16. A number of holes, described below, are machined in the one-piece gas distribution faceplate 1502 that limits the necessity of forming the one-piece gas distribution faceplate 1502 from multiple plates. The one-piece gas distribution faceplate 1502 is machined from a block of aluminum, aluminum nitride, stainless steel, molybdenum, or any material that does not react with the particular chemicals being injected into the one-piece gas distribution faceplate 1502. One-piece gas distribution faceplate 1502 comprises a lower surface 1504, an upper surface 1506, a peripheral mount portion 1507, an internal gas distribution cavity 1509, and a vertical peripheral face 1508. Only a broken-away portion of the one-piece gas distribution faceplate 1502 is shown in FIG. 16. Only a segment of the peripheral ring 1503 is shown in FIG. 16. A portion of the upper surface 1506 is removed to show the structure of the internal gas distribution cavity 1509. The peripheral mount portion 1507 extends radially outward of the peripheral face 1508. The vertical peripheral face 1508 extends circumferentially about the periphery of the upper surface 1506 of the one-piece gas distribution faceplate 1502.

The one-piece gas distribution faceplate has three types of holes drilled therein comprising first holes 1510, second holes 1520, and interconnecting channels 1512A and 1512B. Processes such as electric discharge drilling, mechanical drilling, pressurized reactant drilling, and water jet cutting are drilling technologies that may be used to drill any of the holes or channels 1510, 1520, 1512A, or 1512B (only channels 1512B are shown in FIG. 15). Any known applicable type of drilling technology may be used to drill any of the holes 1510, 1520, 1512A, or 1512B.

An array of first holes 1510 extend between the upper surface 1506 and lower surface 1504. The interconnecting channels are subdivided into those shown as 1512A and 1512B. The location where each interconnecting channel 1512A intersects with one interconnecting channel 1512B defines a junction space 1516 and together define the internal gas distribution cavity 1509. Interconnecting channels 1512A are all parallel to each other, co-planar, and extend between vertical peripheral faces 1508. Interconnecting channels 1512B are also parallel to each other, co-planar, and extend between vertical peripheral faces 1508. The interconnecting channels 1512A are perpendicular to and intersect interconnecting channels 1512B at junction spaces 1516.

First holes 1510 are arranged in an array, and each first hole 1510 as defined within the one-piece gas distribution faceplate 1502 extends between the upper surface 1506 and the lower surface 1504. Second holes 1520 as arranged in an array, and each second hole 1520 is defined within the one-piece gas distribution faceplate 1502, and extends from the lower surface 1504 to a junction space 1516. The junction spaces 1516 are in fluid communication with, and partially define, the internal gas distribution cavity 1509. The array of second holes 1520 is offset from the array of first holes 1510. The second holes 1520 do not extend above the internal gas distribution cavity 1509 as shown in FIG. 16 (they do not continue to the second surface 1506). Gases can freely flow through the internal gas distribution cavity 1509 into the second holes 1520 at junction spaces 1516. The internal gas distribution cavity 1509 thus provides a conduit to supply gases to each of the second holes 1520 from conduit 136.

The peripheral ring 1503 extends about, and is attached to, the one-piece gas distribution faceplate 1502 by first brazed joint 1620 and second brazed joint 1622. A peripheral plenum 1606 is defined between the peripheral ring 1503, the one-piece gas distribution faceplate 1502, the first brazed joint 1620 and the second brazed joint 1622. The peripheral plenum 1606 is in fluid communication with the internal gas distribution cavity 1509. Thus, gasses applied via a gas conduit 1630 to peripheral plenum 1606 will pas via the internal gas distribution cavity 1509 (comprising interconnecting channels 1512A and 1512B) into the second holes 1520.

The first brazed joint 1620 connects a first peripheral edge 1668 of the peripheral ring 1503 to the vertical peripheral face 1508. The second brazed joint 1622 connects a second peripheral edge 1670 of the peripheral ring 1503 to a peripheral edge 1672 of the peripheral mount portion 1507. The first brazed joint 1620 and the second brazed joint 1622 limit the passage of gasses between the peripheral plenum 1606 and outside of the shower head 1602. The brazing process is performed in a similar manner as the brazing process described above, and unifies the peripheral rings 1503 to the one-piece gas distribution faceplate 1502. A plurality of aligned drilled holes 1640 extend through the one-piece gas distribution faceplate 1502. Each drilled hole 1640 is aligned with a drilled hole 1642 that extends through peripheral ring 1503. A fastener 1644 such as a bolt, screw, etc. secures the showerhead 1602 including the one-piece gas distribution faceplate 1502 and the peripheral ring 1503 to a mounting element 1646. Alternatively, the showerhead 1602 may be secured in another known replacable manner to the mounting element 1646 so when the fastener is removed, the one-piece gas distribution faceplate 1507 can be removed and a person can gain access to the conduits 134 and 136 for cleaning.

A gas conduit 1630 extends from the peripheral plenum 1606 to the conduit 136. The conduit 134 is in fluid communication with each one of the plurality of first holes 1510 via the upper surface 1506. The structure and operation of the conduits 134 and 136 is similar to as described. The above descriptions as to the coatings brazing techniques, and materials apply as well to the one-piece gas distribution faceplate 1502.

Although various embodiments which incorporate the teachings of the present invention have been shown and described in detail herein, those skilled in the art can readily devise many other varied embodiments that still incorporate these teachings.

What is claimed is:

1. A one-piece gas distribution faceplate for a showerhead, the one-piece gas distribution faceplate including a first surface, a second surface, and a third surface, the one-piece gas distribution faceplate comprising:

a plurality of first gas holes extending through the one-piece gas distribution faceplate between the first surface and the second surface, the one-piece gas distribution faceplate having an internal gas distribution cavity defined by a plurality of interconnecting channels, a plurality of second gas holes extending through the one-piece gas distribution faceplate between the first surface into the plurality of interconnecting channels, the interconnecting channels are fluidly coupled to a plenum that is in turn connected to at least one gas conduit, the gas conduit extends to the third surface.

2. The faceplate of claim 1 wherein the plurality of interconnecting channels in the one-piece gas distribution faceplate are formed in a criss-cross pattern.

3. The faceplate of claim 1 wherein the faceplate is formed by drilling holes through the one-piece gas distribution faceplate.

4. The faceplate of claim 3, wherein the holes are drilled by one of the processes including electric discharge drilling mechanical drilling, pressurized reactant drilling, and waterjet drilling.

5. A showerhead for a semiconductor wafer processing system comprising:

a one-piece gas distribution faceplate including a first surface, a second surface, and a third surface, the one-piece gas distribution faceplate comprising a plurality of first gas holes extending through the one-piece gas distribution faceplate between the first surface and the second surface, the one-piece gas distribution faceplate having an internal gas distribution cavity defined by a plurality of interconnecting channels, a plurality of second gas holes extending through the one-piece gas distribution faceplate between the first surface into the plurality of interconnecting channels, the interconnecting channels are fluidly coupled to a plenum that is in turn connected to at least one gas conduit, the gas conduit extends to the third surface; and a gas distribution manifold assembly, coupled to said one-piece gas distribution faceplate, for supplying a first gas to the first gas holes in said one-piece gas distribution faceplate and a second gas to the second gas holes in said one-piece gas distribution faceplate.

6. The showerhead of claim 5 wherein a cold plate is affixed to said gas distribution manifold assembly.

7. The showerhead of claim 5 wherein the interconnecting channels in the one-piece gas distribution faceplate are formed in a criss-cross pattern.

8. The showerhead of claim 5 wherein each of the first gas holes are at least partially defined by a tube.

9. The faceplate of claim 5 wherein the faceplate is formed by drilling holes through the one-piece gas distribution faceplate.

10. The faceplate of claim 9, wherein at least one of the first holes, or the second holes are drilled in said one-piece gas distribution faceplate by one of the processes including electric discharge drilling, mechanical drilling, pressurized reactant drilling, and waterjet drilling.

11. The showerhead of claim 5 wherein the gas distribution manifold further comprises a first gas channel that supplies the first gas to the plurality of first gas holes in said one-piece gas distribution plate.

12. The showerhead of claim 5 wherein the gas distribution manifold further comprises a second gas channel that has an annular cavity and radial channels extending from the annular cavity that supply the second gas to the plenum.

13. A chemical vapor deposition reactor comprising:

a vacuum chamber defining a deposition region;

a wafer support pedestal, positioned within said vacuum chamber and proximate said deposition region;

a showerhead, positioned within said vacuum chamber and proximate said deposition region, where said show erhead comprises a one-piece gas distribution faceplate including a first surface, a second surface, and a third surface, the one-piece gas distribution faceplate comprising a plurality of first gas holes extending through the one-piece gas distribution faceplate between the first surface and the second surface, the one-piece gas distribution faceplate having an internal gas distribution cavity defined by a plurality of interconnecting channels, a plurality of second gas holes extending through the one-piece gas distribution faceplate between the first surface into the plurality of interconnecting channels, the interconnecting channels are coupled to a plenum that is in turn fluidly coupled to at least one gas conduit, the gas conduit extends to the third surface; and a gas distribution manifold assembly, coupled to said one-piece gas distribution faceplate, for supplying a first gas to the first gas holes in said one-piece gas distribution faceplate and a second gas to the second gas holes in said one-piece gas distribution faceplate.

14. The chemical vapor deposition reactor of claim 13 where said first gas is titanium tetrachloride and said second gas is ammonia.

15. The faceplate of claim 13, wherein at least one of the first holes, or the second holes are drilled in said one-piece gas distribution faceplate by one of the processes including electric discharge drilling, mechanical drilling, pressurized reactant drilling, and waterjet drilling.

* * * * *